(12) United States Patent
Van Dijsseldonk et al.

(10) Patent No.: US 7,307,262 B2
(45) Date of Patent: Dec. 11, 2007

(54) LITHOGRAPHIC APPARATUS AND DEVICE MANUFACTURING METHOD

(75) Inventors: Antonius Johannes Josephus Van Dijsseldonk, Hapert (NL); Dominicus Jacobus Petrus Adrianus Franken, Veldhoven (NL); Robertus Johannes Marinus De Jongh, Eindhoven (NL); Jacob Kleijn, Wintelre (NL); Bastiaan S H Jansen, Waalre (NL); Marc Van Der Wijst, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 91 days.

(21) Appl. No.: 11/019,524

(22) Filed: Dec. 23, 2004

(65) Prior Publication Data

US 2006/0139598 A1   Jun. 29, 2006

(51) Int. Cl.
*G21G 5/00* (2006.01)
(52) U.S. Cl. ............... 250/492.1; 250/548; 355/67
(58) Field of Classification Search .......... 250/492.1
See application file for complete search history.

(56) References Cited

U.S. PATENT DOCUMENTS

| 6,414,743 | B1 * | 7/2002 | Nishi et al. ............ 355/69 |
| 6,563,128 | B2 * | 5/2003 | Lublin et al. ........... 250/548 |
| 2003/0007138 | A1 * | 1/2003 | Shigematsu et al. ....... 355/67 |
| 2004/0114121 | A1 * | 6/2004 | Nishi et al. ............ 355/67 |

* cited by examiner

*Primary Examiner*—Nikita Wells
*Assistant Examiner*—Phillip A. Johnston
(74) *Attorney, Agent, or Firm*—Pillsbury Winthrop Shaw Pittman LLP

(57) ABSTRACT

A lithographic apparatus includes a projection system including a movable optical element. The movable optical element is capable, by a displacement thereof to influence a position quantity of a radiation beam projected by the projection system. A control device is provided to drive the optical element actuator to influence a position quantity of the movable optical element, thereby influencing a position quantity of the radiation beam as projected by the projection system. The control device is adapted to move the movable optical element to position the radiation beam as projected by the projection system with respect to the substrate, or to correct a position quantity of the radiation beam as projected by the projection system caused by any type of disturbance on the projection system.

20 Claims, 6 Drawing Sheets

LITHOGRAPHIC APPARATUS AND DEVICE MANUFACTURING METHOD

FIELD

The present invention relates to a lithographic apparatus and methods.

BACKGROUND

A lithographic apparatus is a machine that applies a desired pattern onto a substrate, usually onto a target portion of the substrate. A lithographic apparatus can be used, for example, in the manufacture of integrated circuits (ICs). In that circumstance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The lithographic apparatus includes a projection system to project a patterned radiation beam onto the substrate. The projection system may include optical elements, such as mirrors or lenses. The projection system provides for a projection of the patterned radiation beam onto a target portion of the substrate. As accuracy and resolution of the pattern to be projected onto the substrate increases year after year, requirements on accuracy of the projection system increase too. A difficulty associated with a conventional projection system is that a position of the output beam of the projection system and thus a position of an image with respect to the substrate shows a tolerance due to, e.g., vibrations in the lithographic apparatus, tolerances of optical components or other components in the projection system, temperature deviations causing thermal effects such as expansion, drift of one or more sensors involved, and other causes. Further factors influencing a position of the output beam of the projection system include positioning errors of a light source or positioning errors of the patterning device which also may result in a positioning error of the output beam of the projection system.

One way to compensate for such errors could be by a displacement of the substrate, thus displacing the substrate to compensate for a position error of the output beam of the projection system irradiating (a part of) the substrate. However, such a solution may only be partly effective, as a positioning of the substrate to compensate for any position errors in the output beam of the projection system is slow as it requires a displacement of the substrate as well as the substrate table by which the substrate is held, and this solution being associated with a positioning (thus acceleration and deceleration) of a part having a considerable mass.

SUMMARY

It is desirable to enhance a performance of a positioning of the radiation beam as projected by the projection system.

According to an embodiment of the invention, there is provided a lithographic apparatus including a projection system configured to project a radiation beam onto a target portion of a substrate; wherein the projection system includes a movable optical element to influence by a displacement thereof a position quantity of the radiation beam as projected by the projection system, the optical element being movable by an optical element actuator; and wherein the lithographic apparatus further includes a projection system control device or projection system controller, operationally connected to the optical element actuator to drive the optical element actuator to influence the position quantity of the radiation beam as projected by the projection system. According to an embodiment of the invention, there is provided a lithographic apparatus including: a projection system configured to project a radiation beam onto a target portion of a substrate, the projection system including two optical elements at least partly determining an optical path of the projection system, a position quantity of one of the optical elements being controllable by a control loop, wherein the lithographic apparatus includes a feed forward control device, the feed forward control device having a feed forward control device input operationally connected to a signal in the control loop of one of the two optical elements, and a feed forward control output operationally connected to an actuator to affect a position quantity of the other one of the optical elements based on the signal of the control loop of the one of the optical elements.

According to an embodiment of the invention, there is provided a device manufacturing method including projecting a beam of radiation onto a target portion of a substrate via a projection system, the method including controlling a position quantity of a movable optical element of the projection system to influence a position quantity of the radiation beam as projected by the projection system.

According to an embodiment of the invention, there is provided a device manufacturing method including projecting a beam of radiation onto a target portion of a substrate via a projection system, the projection system including two optical elements at least partly determining an optical path of the projection system, a position quantity of one of the optical elements being controlled by a control loop, including affecting a position quantity of the other one of the optical elements based on the signal of the control loop.

BRIEF DESCRIPTION OF THE DRAWINGS

Embodiments of the invention will now be described, by way of example only, with reference to the accompanying schematic drawings in which corresponding reference symbols indicate corresponding parts, and in which.

In the figures, same references and symbols refer to same or similar items.

DETAILED DESCRIPTION

Figure 1:
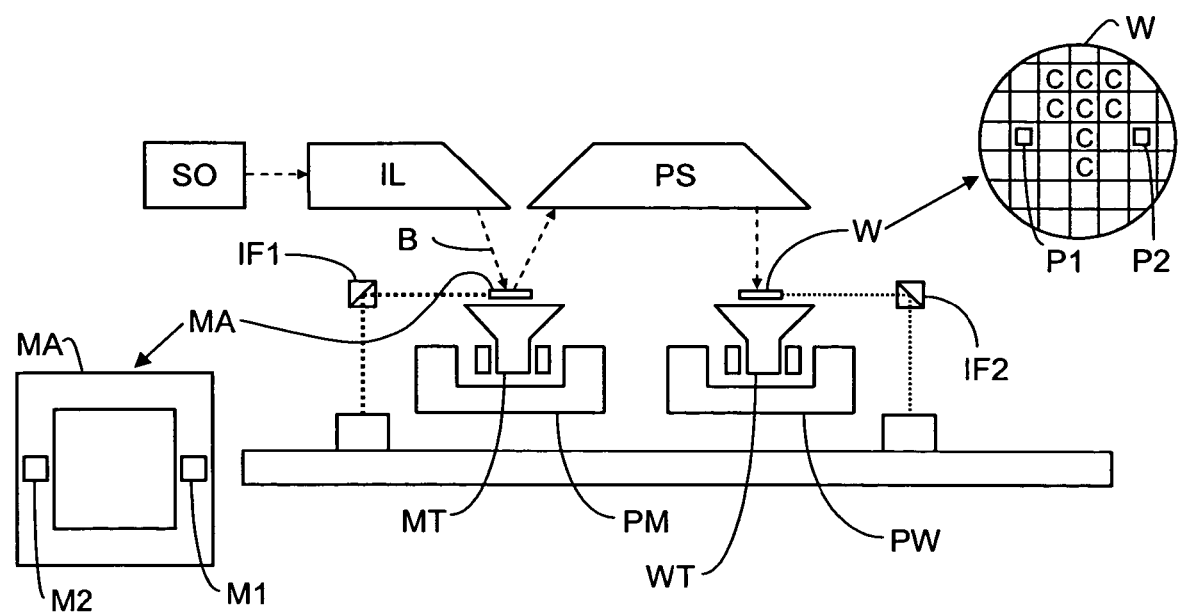
FIG. 1 depicts a lithographic apparatus according to an embodiment of the invention.

FIG. 1 schematically depicts a lithographic apparatus according to one embodiment of the invention. The apparatus includes: an illumination system (illuminator) IL configured to condition a radiation beam B (e.g. UV radiation or EUV radiation) and a support structure (e.g. a mask table) MT constructed to support a patterning device (e.g. a mask) MA and connected to a first positioner PM configured to accurately position the patterning device in accordance with certain parameters. The apparatus also includes a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example, if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD (not shown in FIG. 1) including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD (not shown in FIG. 1) for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO (not shown in FIG. 1). The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. After being reflected on the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

Step mode: the mask table MT and the substrate table WT are kept essentially stationary, while an entire pattern imparted to the radiation beam is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.

Scan mode: the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

Another mode: the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
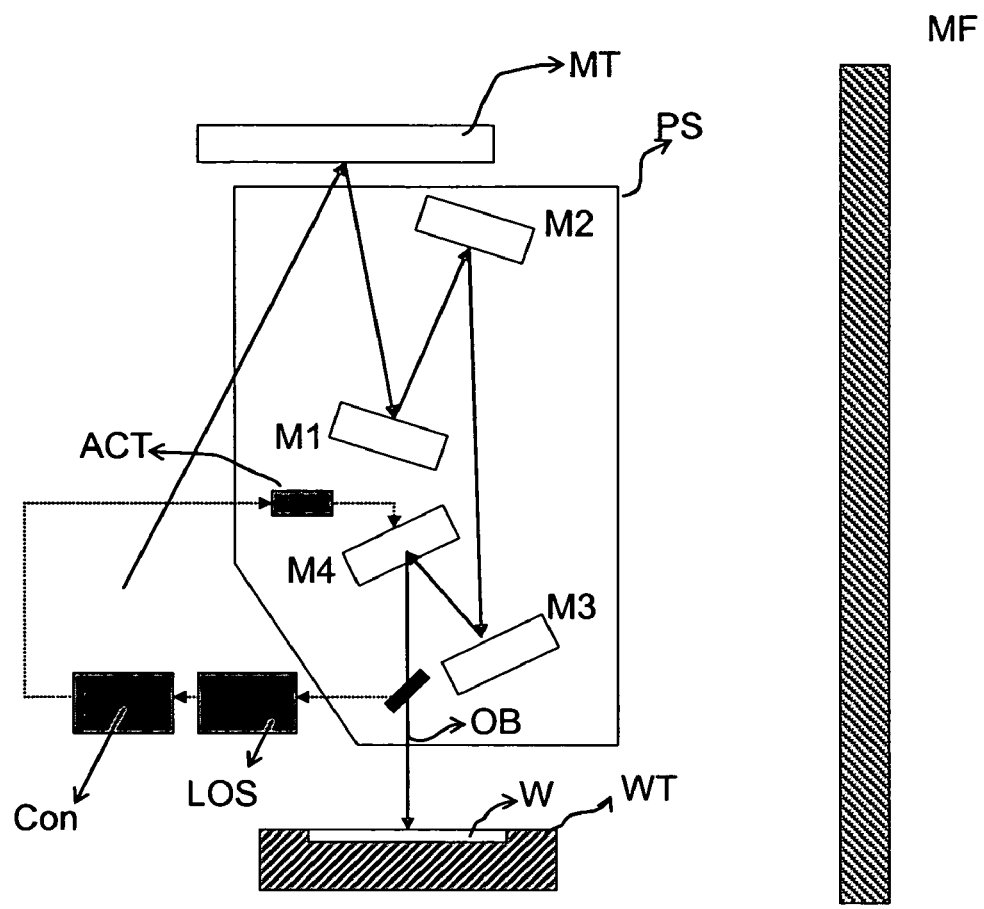
FIG. 2 depicts a detailed view of a part of the lithographic apparatus according to an embodiment of the invention.

FIG. 2 shows a detailed view of a projection system PS of the lithographic apparatus. In this embodiment, the projection system includes a plurality of mirrors, in this example 4 mirrors, indicated by M1 . . . M4. An incoming beam of the projection system enters the projection system after having been reflected by a suitable part of the patterning device held by the support structure MT is reflected successively by the mirrors M1, M2, M3 and M4 to leave the projection system and irradiate a part of the substrate W held by the substrate table WT. In a practical implementation, the radiation irradiating the substrate W may include a single beam (such as in beam lithography applications) or may include a patterned image (patterned by e.g. a patterning device MA such as a mask, reticle, etc.). In the example shown in FIG. 2, the support (such as the mask table) MT is positioned above the projection system PS, however also other configurations, such as the configuration shown in FIG. 1 where the mask table MT is positioned in a different position, are possible too. The skilled person will however understand the principles as outlined below. According to embodiments of the invention, one or more of the mirrors, and in this embodiment in particular the mirror M4 is movable by an actuator ACT. The actuator may include a position actuator such as an electric or pneumatic motor, a piezo electrical element, etc. The actuator is driven by a positioning system control device Con, or positioning system controller, being adapted to drive the actuator ACT. By changing a position of the mirror M4, a position of the patterned beam as projected by the projection system PS onto the substrate W will change. In the view shown in FIG. 2, a rotation of the mirror M4 in clockwise direction is likely to cause a displacement (in particular a rotation) of a patterned beam OB projected by the projection system PS to the left in a plane of drawing, while a rotation of the mirror M4 in anti-clockwise direction will cause a displacement of the output beam OB on the substrate W to the right in the plane of the drawing. In the example shown in FIG. 2, the mirror M4 forms a movable optical element, however it is also possible that any other element of the projection system PS forms such a movable optical element, such as e.g. any of the mirrors M1-M3. The mirrors M1-M4 together define an optical path along which a beam entering the projection system propagates. A benefit of making use of a movable optical element which is situated, along the optical path in this example defined by the mirrors M1-M4, near an output of the projection system PS, thus along the optical path near the substrate W, is that in general a sensitivity of this mirror is high: In general, this mirror has a large footprint, and therefore a small tilt of the mirror causes a comparably large translation of the output beam with respect to the substrate. Alternatively, any of the other mirrors M1-M3 (or in general terms: any of the optical elements) could be used also, however a smaller sensitivity of such mirror would require a larger tilting thereof which is related to its smaller footprint. In the below, the patterned beam as projected by the projection system will in short be indicated by output beam OB. Due to the high sensitivity of a displacement of the mirror M4, only small displacements thereof are required, thus making a fast correction possible and introducing little vibrations, shocks or other mechanical disturbances due to a displacement of the mirror M4, as its displacement is relatively small. The lithographic apparatus may further include an optical sensor, in this example the line of sight sensor LOS to determine a line of sight through the projection system. The optical sensor provides a position signal representative of the position of the patterned radiation beam as projected by the projection system. The optical sensor is operationally connected (as indicated by the dotted line) to the projection system control device Con or projection system controller. The projection system control device Con is arranged to drive the actuator ACT in dependency on the position signal as provided by the position sensor (in this example the line of sight sensor LOS). The optical sensor may provide a position signal representative of the position of the output beam OB with respect to the projection system PS itself, with respect to the substrate table WT, or with respect to any other reference, such as the metrology frame MF as schematically depicted in FIG. 2. Being provided with the position signal, the projection system control device Con, or projection system controller, is able to drive the actuator ACT to position the mirror M4 such that the output beam OB leaves the projection system PS at a desired position. The desired position may be a desired position with respect to the projection system, with respect to the substrate table WT or with respect to the metrology frame MF or with respect to any other reference. The lithographic apparatus may further include a projection system position measurement device to measure a position of the projection system with respect to a reference, such as the metrology frame MF. Further, the lithographic apparatus may include a substrate table position measurement system to measure a position of the substrate table WT with respect to the metrology frame MF or any other suitable reference. In a practical embodiment, the line of sight sensor provides a position signal representative of a position of the output beam OB with respect to the metrology frame, as the line of sight sensor LOS is mechanically connected to the metrology frame MF. As the position of the substrate table WT with respect to the metrology frame is known too, as it is measured by the substrate table positioning system (not shown), any deviations in the position of the output beam OB with respect to the position of the substrate table WT can be corrected accordingly, according to the invention by setting the position of the movable optical element, in this example the mirror M4. Thus, instead of displacing the substrate table WT to correct for a position error in the output beam OB, the position of the movable optical element is corrected, which can provide for a correction at a much higher bandwidth, as the mass of the mirror M4, or any other suitable optical element, is in most practical embodiments lower than a mass of the substrate table WT. In embodiments in which the displacement of the optical element (such as in this example the mirror M4) includes a rotation, a further benefit comes into existence, being that a rotation of the optical element may require a much lower force as compared to a translation: A translation involves application of a force to the optical element to be translated, the force being equal to its mass times an acceleration of the optical element (in accordance with Newton's Law ). A rotation however involves application of a force with respect to a centre of the optical element to be rotated, which is smaller. Furthermore, a rotation of the optical element alters an optical angle of incidence as well as an optical exit angle, thus having a dual effect on displacement of the output beam. As a result, a rotation of the optical element required a much lower force then a translation thereof to achieve a similar effect on a displacement of the output beam. A still further benefit is that in a practical implementation the optical element (such as the mirror M4) includes a higher dynamic internal stiffness than the substrate table. Thus, a positioning of the mirror to compensate for any displacement of the output beam could be performed with a higher speed (or e.g. a more aggressive control loop) than a positioning of the substrate table to compensate for the displacement.

Connections between the control device Con, or controller, and the actuator ACT, and between the control device Con and the line of sight sensor LOS may include any type of suitable connection, such as an analogue connection (e.g. an electrical analogue line), or any type of digital connection (e.g. multiplexed, bus structure, etc).

The line of sight sensor may include a sensor such as described in co-pending U.S. patent application 2004/0189966 which is incorporated herein by reference.

The sensor (a line of sight sensor or any other sensor) may provide a position signal with respect to any reference. Examples of such a reference include the metrology frame, the projection system, the substrate table etc. In an embodiment where the control device, or controller, is arranged to drive the optical element actuator in dependency on the position signal provided by the sensor, this positioning of the radiation beam as projected by the projection system can therefore take place with respect to any such reference.

A projection system including movable optical elements which are capable of influencing a position of an output beam of the projection system are described in EUV Alignment and Testing of a Four-Mirror Ring Field EUV Optical System, K. A. Goldberg et al, EIPBN 2000, EUV Lithography, #172, which is incorporated herein by reference. The movable optical element as referred to in this document may include any movable optical element as described in the literature referred to, instead of or in addition to the examples as described in this document.

Figure 3A:
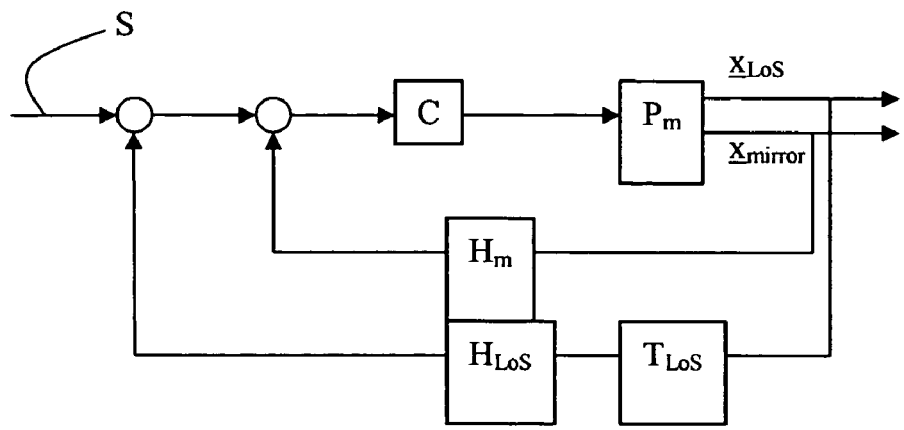
FIG. 3a-c schematically depict control loops to be applied in the lithographic apparatus according to FIG. 2.
Figure 3B:
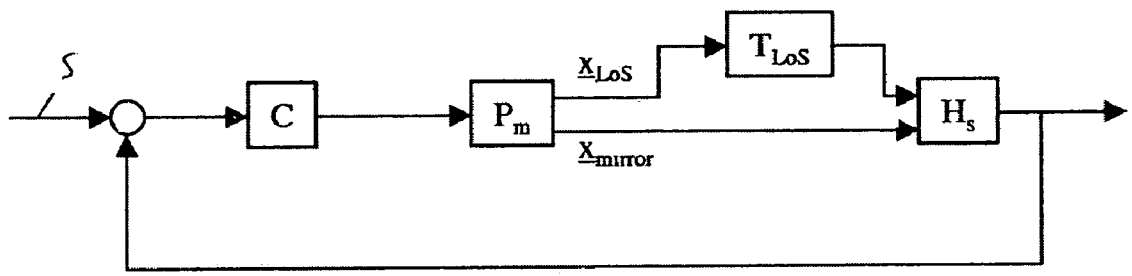
Figure 3C:
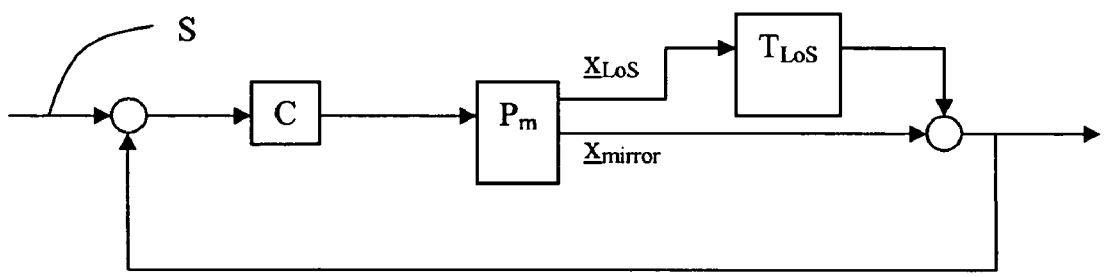

FIG. 3a-c show control loops, in accordance with embodiments of the invention, providing schematic examples of a control loop as established by the projection system control device Con, or projection system controller, the position actuator ACT, the movable optical element M4, and the line of sight sensor LOS.

FIG. 3a shows a control loop including a controller C, a movable optical element, schematically indicated by $P_m$, and two feed back paths. The controller C includes the projection system control device Con, or projection system controller, as depicted and described with reference to FIG. 2, and $P_m$ in FIG. 3a includes the actuator ACT and the movable optical element, in this example the mirror M4. The item $P_m$ may further include the line of sight sensor LOS and a position sensor sensing a position of the movable optical element, in this example the mirror M4. This sensor is not shown in FIG. 2. The setpoint S in FIG. 3a is provided with a setpoint value representing a position quantity, such as in FIG. 3a a nominal position of the mirror M4. A first feed back path extends from an output signal $X_{mirror}$ of a position sensor sensing a position of the mirror via a transfer function $H_m$ to the controller C. A second feed back path extends from an output signal $X_{LOS}$ of the line of sight sensor via a transformation $T_{LOS}$ and a transfer function $H_{LOS}$ to the controller C. The transformation $T_{LOS}$ transforms one or more coordinates as provided by the output signal of the line of sight sensor into angular information. Due to the dual feed back paths, an over determined control system may have been created. Interference between the dual control loops is prevented by a suitable choice of transfer functions of the filters $H_{LOS}$ and $H_m$. The transfer function of $H_m$ may include a low pass filter while the transfer function of $H_{LOS}$ may include a high pass filter, or vice versa. Such a filtering may be implemented in an analogue way or making use of digital filters having a stated frequency characteristic, however it is also possible that such a desired characteristic is obtained by having one of the feed back paths run at a significantly lower sample frequency than the other one of the feed back paths. This not only leads to a simple implementation but also reduces processing load in a numeric implementation including e.g. a microprocessor or other numeric device. Alternatively, it is possible that one of the feed back paths shown in FIG. 3a is implemented in software while the other one is implemented in hardware. Thus, the configuration shown in FIG. 3a offers a flexible way of implementation.

FIG. 3a as well as FIGS. 3b and 3c which will be described below each provide an example of a combined control system. If a position of the mirror is altered, $X_{LOS}$ is changed, as a transfer characteristic of the projection system is changed. Thus, a change in a position of the mirror will reflect in a change of the output signal of the $X_{LOS}$ as well as a change of the output signal $X_{mirror}$. The control system as described in FIGS. 3a-c each provide a solution to be able to cope with this dependency in the control loop.

FIG. 3b shows a control loop which has been modified with respect to FIG. 3a. The output signal $X_{LOS}$ is led to a transformation $T_{LOS}$, which may be the same as the transformation $T_{LOS}$ in FIG. 3a. Then, the output signal of the transformation $T_{LOS}$ as well as the position of the mirror $X_{mirror}$ are both provided to a transfer represented by a transfer function $H_S$. The transfer function $H_S$ includes a dual input transfer function. The transfer function $H_S$ may include a hardware filter or may be implemented in software. With reference to FIG. 3a, it was described that the transfer function of $H_M$ and the transfer function of $H_{LOS}$ may differ, e.g. one including a low pass filter characteristic while the other one including a high pass filter characteristic. In the same manner, the transfer function of the $H_S$ in FIG. 3b may differ depending on the input: a transfer function from the input $X_{mirror}$ to the output may, e.g., include a low pass filter characteristic while a transfer function from the transformed line of sight information may include a high pass filter characteristic or vice versa. An advantage of the configuration as shown in FIG. 3b as compared to the configuration shown in FIG. 3a is that the configuration in FIG. 3b is more simple to implement.

FIG. 3c shows yet another alternative for the control loop as depicted in FIGS. 3a and 3b. In FIG. 3c, the signal $X_{LOS}$ as provided by the line of sight sensor is also provided to a transformation $T_{LOS}$, which may be identical to the transformation $T_{LOS}$ shown in FIGS. 3a and 3b. To avoid any over-determination in the control loops, the signal $X_{mirror}$ comprises a signal in 4 degrees of freedom at maximum. Thus, instead of providing a signal $X_{mirror}$ in 6 degrees of freedom, supplemented by a signal $X_{LOS}$ including 2 degrees of freedom and thus resulting in an over-determined system, information regarding 2 degrees of freedom is left away in the signal $X_{mirror}$. In a practical implementation, the signal $X_{LOS}$ includes a rotation information with respect to two rotation axes of the mirror M4. To prevent over-determination, the signal $X_{mirror}$ includes at maximum 4 degrees of freedom, e.g. not including the rotation information of the mirror around the two axes as is provided by the signal $X_{LOS}$. An advantage of the configuration as depicted and described with reference to FIG. 3c is that it allows for a more simple implementation, as the dual input filter $H_S$ to filter out a part of the information provided by $X_{mirror}$, and $X_{LOS}$ is not required any more and fewer sensors are required. In the configuration depicted in FIG. 3c, a further filter may be included in the feed back path (not depicted).

Summarizing, each of the examples of control loops as depicted in FIGS. 3a-3c will attempt to position the movable optical element such that the output beam of the projection system leaves the projection system at a predetermined position with regard to a reference. The predetermined position is influenced by a signal provided to the setpoint input S. As described with reference to FIG. 2, the line of sight sensor (or any other suitable sensor) may provide a position information with reference to the projection system, or e.g. the metrology frame MF. If in the control loops as depicted in FIGS. 3a-3c, the line of sight sensor provides a position information with reference to the projection system itself, the control loops will tend to control the output beam with respect to the projection system itself, and in case that the line of sight sensor provides a position information with respect to the metrology frame as a reference, then the control loops depicted in FIGS. 3a-3c will attempt to control the position of the output beam with respect to the metrology frame.

Figure 4:
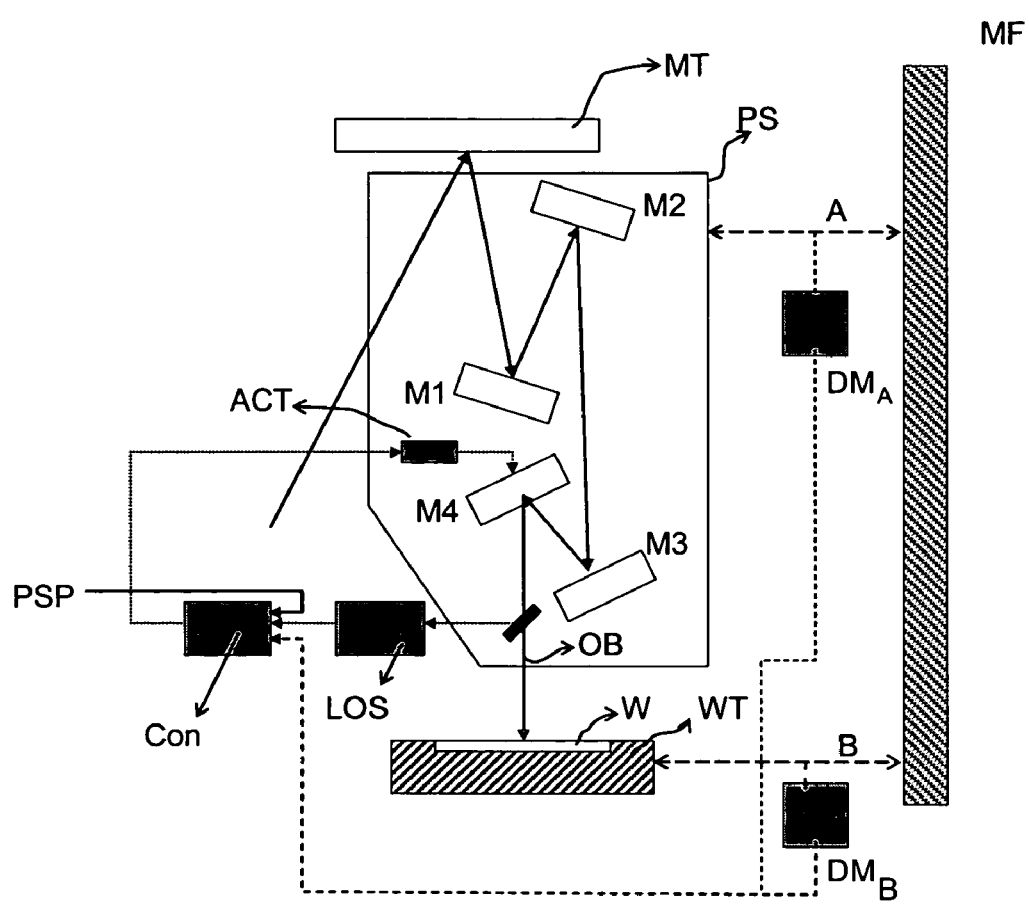
FIG. 4 depicts a detailed view of a lithographic apparatus according to another embodiment of the invention.

The additional possibilities offered by a distance measurement between projection system and metrology frame and a distance measurement between substrate table and metrology frame are further explained with reference to FIG. 4. In the highly schematic view of a part of the lithographic apparatus, as depicted in FIG. 4, a first distance measuring system is shown, measuring a distance between the projection system PS and the metrology frame MF, the distance being indicated by A, the distance measuring system being indicated by $DM_A$. Likewise, a second distance measuring system $DM_B$ is shown measuring a distance B between the substrate table WT and the metrology frame MF. The distance information as provided by the distance measurement system $DM_A$ and $DM_B$, are provided to the projection system control device Con, or projection system controller. It is possible that the distances A and B as measured by the respective distance measurement systems are each provided to the control device Con separately, however it is also imaginable that the distance information are combined, e.g. by a subtraction, a difference between the distances A and B being provided to the control device Con. The projection system control device Con, or projection system controller, is thus provided with information concerning the detected position of the substrate, as represented by the measured distance B, possibly in combination with the measured distance A. As shown in FIG. 4, the control device Con further includes a position information setpoint input PSP, indicated as position setpoint in the below. The position setpoint PSP provides to the control device Con a position setpoint information of the substrate. The position setpoint information may include a desired position of the substrate table WT (a positioning of the substrate table WT with respect to the projection system PS will result in a positioning of the substrate W with respect to the patterned output beam of the projection system), but may also include another position information, such as a desired position of the patterned output beam. The position setpoint information thus provides a position information representing a desired position at which the output beam is to irradiate the substrate. For a description of the actuator ACT, the movable mirror M4, and the line of sight sensor LOS, reference is made to FIG. 2. With the aid of the position setpoint input PSP, a position information is provided to the control device Con. The position setpoint provides setpoint information related to a position of the output beam OB with respect to the substrate W, or provides any other position related information. Should, e.g., an actual position of the substrate (as measured by the measurement system $DM_B$) not coincide with a position information as supplied to the position setpoint input PSP, then according to the invention the control device Con drives the actuator ACT to position the mirror M4 such that a position of the output beam OB is amended to correct for the position error of the substrate W. According to the state of the art, the substrate table WT is positioned by a coarse positioning system, commonly indicated as long stroke (i.e. a positioning system including a long stroke actuator) and a fine positioning system, commonly indicated as short stroke (i.e. comprising a short stroke actuator). A coarse positioning of the substrate table is thus provided by the long stroke actuator and associated positioning system while a fine positioning is provided by the short stroke actuator. The set up as described with reference to FIG. 4 now makes it possible to substitute a part of the positioning function of the short stroke actuator and long stroke actuator, or its positioning function in its entirety, by a positioning of the output beam OB as described with reference to FIG. 4. It is imaginable that the fine positioning as currently implemented by the short stroke actuator and related positioning system may be abandoned, thus only the coarse positioning of the substrate making use of the long stroke actuator and related positioning system being provided, a function of the fine positioning of the substrate table being accomplished by a positioning of the mirror M4 as described with reference to FIG. 4, thus effectively fine positioning the output beam OB with respect to the substrate W instead of fine positioning the substrate W with respect to the output beam OB. An advantage of a positioning of the mirror M4, thus a positioning of the output beam to replace a fine positioning of the substrate table WT, is that a mass of the mirror M4 (or of another suitable optical element) is in general smaller, than a mass of the substrate table WT holding the substrate W, thus enabling a significantly faster positioning and allowing to counteract any positioning disturbances within a significantly larger frequency band. Also, other advantages as described above and being related to rotation instead of translation, and being related to the dynamic stiffness of the to be displaced mirror, are applicable too. As a displacement of the mirror M4 effectively results in a change of an optical imaging of the projection system PS, i.e. a change of the optical transfer characteristic of the projection system PS, a situation may occur where the substrate W, at the location where it is irradiated by the output beam OB, is not in the focus plane of the projection system PS due to the amended transfer characteristic of the projection system by a change of the position of the mirror M4. Further, other optical effects might occur due to a change in the position of the mirror M4. Also, due to a displacement of the mirror M4 from is nominal position, a change of a length of the optical path from the mirror M4 to the substrate W might change. To compensate this, it is possible to provide for a displacement of the mask table MT (and possibly also other elements such as one or more other mirrors), thus effectively displacing the mask MA. To accomplish this, suitable position actuators for displacing the mask table MT might be included (not shown in FIG. 4), as well as a suitable position control system (also not shown in FIG. 4). Thus, a displacement of the mirror M4 changing an optical output parameter of the projection system PS may be compensated for by an appropriate displacement of the mask table MT to displace the mask MA. In a current, common implementation, the projection system comprises a 4:1 projection system, in which case a displacement of the mask table MT and a displacement of the substrate table WT (or instead thereof a displacement of the mirror M4 having a comparable effect) will be in a related 4:1 relationship to each other.

Figure 5:
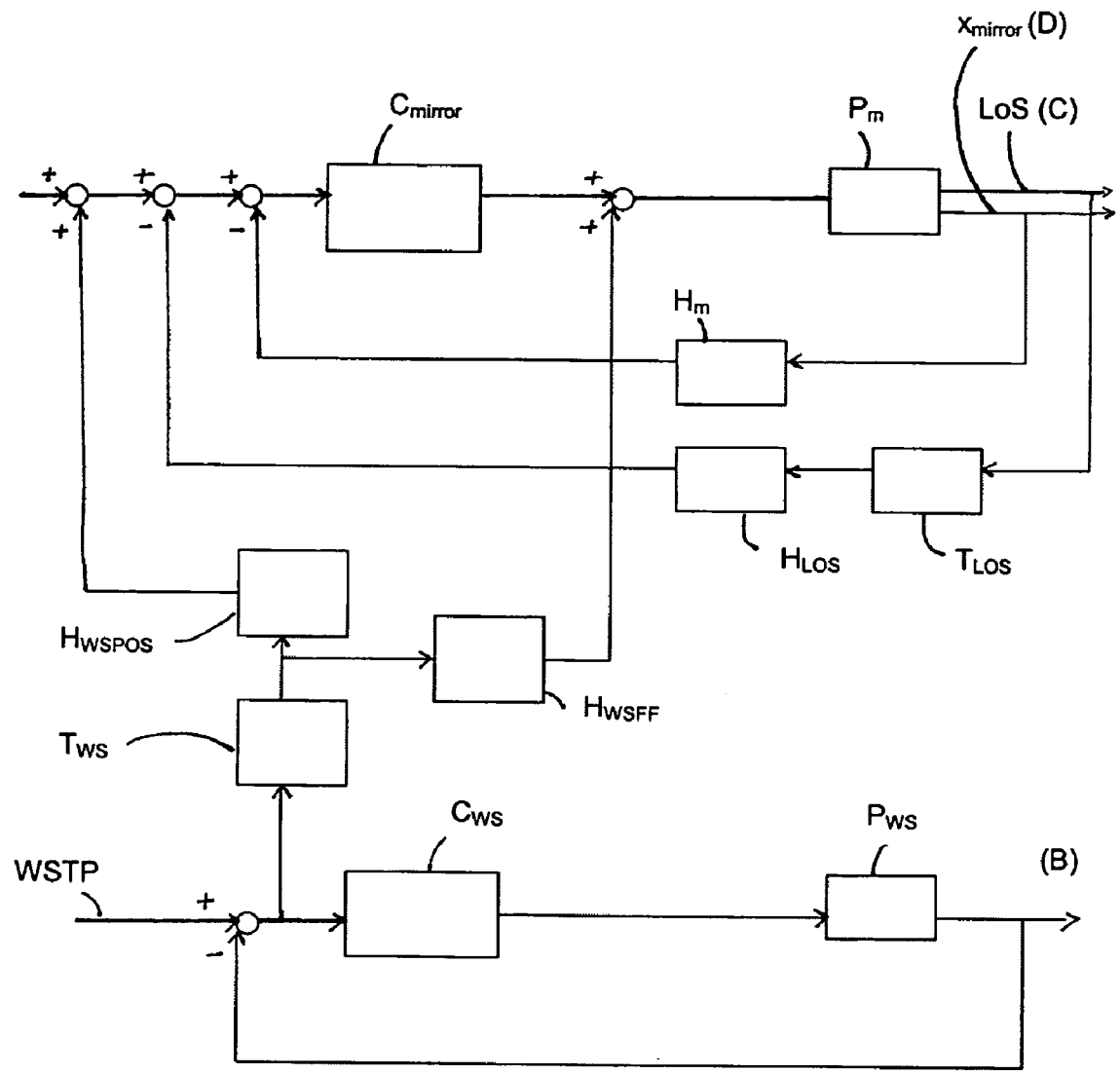
FIG. 5 depicts a control loop of the lithographic apparatus according to FIG. 4.

FIG. 5 shows a symbolic control scheme of the control system as depicted and described with reference to FIG. 4. The control scheme comprises a first part consisting of the controller $C_{mirror}$, as well as the actuator and movable mirror M4, a transfer function of which being schematically indicated by $P_m$, and two feed back paths respectively including a transfer function $H_m$ and a transfer function $H_{LOS}$ supplemented by a transformation $T_{LOS}$. This first part substantially corresponds to the control scheme as depicted in FIG. 3a. This part might also be replaced by the control schemes as depicted in FIG. 3b resp. 3c. The control scheme as depicted in FIG. 5 further includes a second part including a wafer stage position controller $C_{ws}$ and a wafer stage actuator plus wafer stage, a transfer function of which being schematically indicated by $P_{ws}$. The second part is provided with a wafer stage setpoint WTSP information at a wafer stage setpoint input. The first part of the control scheme depicted in FIG. 5 thus controls the movable mirror M4 in a manner similar to the one described with reference to FIGS. 3a-3c, while the second part includes a position control system for controlling a position of the substrate table as is known in the art. The control scheme depicted in FIG. 5 further includes a path from the second part to the first part. This path starts at an error signal of the substrate table control loop, i.e. an input of the controller $C_{ws}$. The path includes an actuator feed forward path from the error signal of the substrate table position control loop (i.e. the second part) to the actuator of the movable mirror M4, this path being formed by $T_{ws}$ and $H_{wsff}$. This feed forward path provides for an immediate compensation, i.e. a position error of the substrate table, as present at the input of the controller $C_{ws}$ results in a feed forward correction of the position of the mirror M4 via the feed forward path, thus a position error of the substrate table being compensated by a suitable alteration of the position of the mirror M4. The feed forward path also includes a setpoint feed forward path including $T_{ws}$ and $H_{wspos}$. The position of this setpoint feed forward path prevents that a change of position of the mirror M4 effectuated via the actuator feed forward path is counter acted by the feed back loops of the first path of the control scheme of FIG. 5. The actuator feed forward path thus enables a fast feed forward correction while the setpoint feed forward path provides for an accurate, steady state feed forward correction. As has also been remarked with reference to FIG. 2 and FIGS. 3a-3c, the control systems as depicted in FIGS. 4 and 5 may also consist of a control system in up to 6 degrees of freedom, i.e. although only a single line, a single actuator, a single sensor, a single setpoint signal, a single controller, etc. has been depicted, all these elements might be present in up to 6 fold for a positioning, position correction, etc. in up to 6 degrees of freedom.

Figure 6:
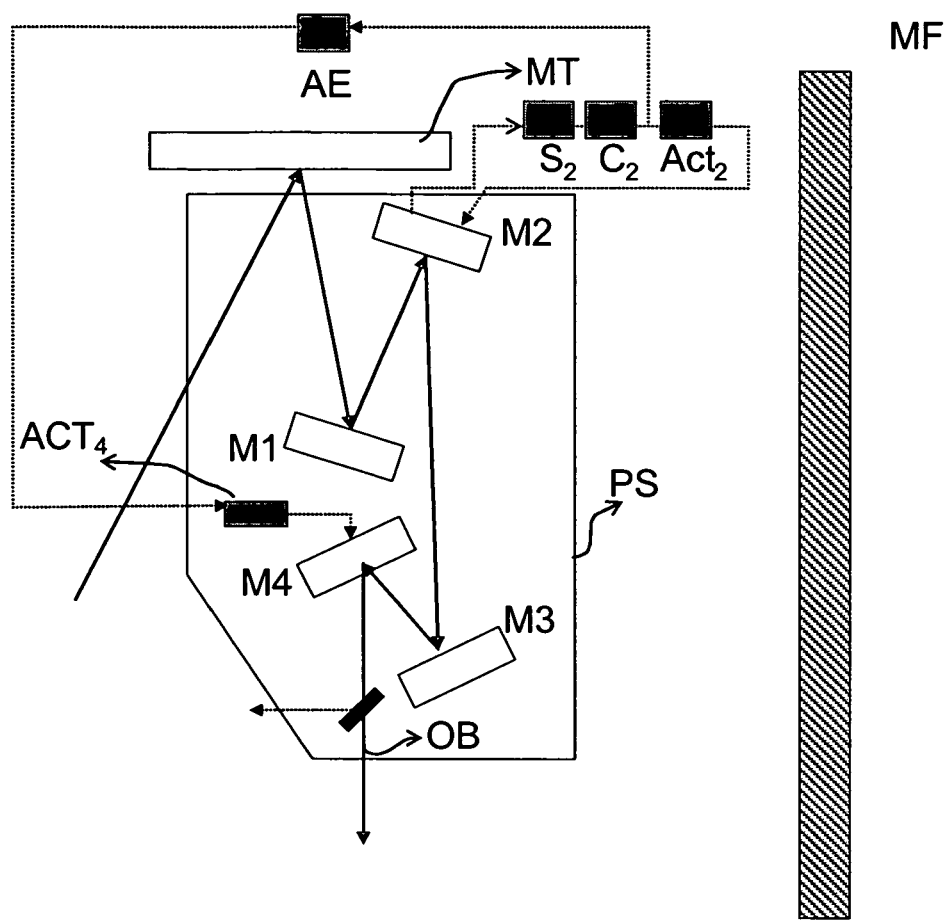
FIG. 6 depicts a detailed view of a part of the lithographic apparatus according to still another embodiment of the invention.

FIG. 6 shows a schematic view of a projection system PS of a lithographic apparatus according to a further embodiment of the invention. Mirrors M1-M4 defining an optical path through the projection system PS may, but need not necessarily be identical or similar to the ones described with reference to FIGS. 2 and 4. In addition to the projection system as shown in FIGS. 2 and 4, FIG. 6 also shows a position control system for another mirror, in this example being mirror M2. The position $C_2$ to control a position of the mirror M2 based on a position data as provided by the sensor $S_2$, and an actuator $ACT_2$ to position the mirror M2. The actuator (which may include a motor, piezo electric actuator or any other suitable positioning device) is driven by the controller $C_2$. The position controller system may also include a setpoint input to provide a setpoint position, i.e. a desired position, to e.g. the controller $C_2$ thus offering a setpoint to the position control loop. The position control loop of mirror M2 serves to stabilize the mirror M2, i.e. to counter act any disturbances, such as caused by mechanical vibrations of the lithographic apparatus or a part thereof, etc. The signal which is supplied by the controller $C_2$ to the actuator $ACT_2$ is substantially proportional to a force by the actuator $ACT_2$ on the mirror M2. The force acting on the mirror M2 is substantially proportional to a disturbance within a frequency range within which the position control loop of the mirror M2 is active. The signal provided by the controller $C_2$ to the actuator $ACT_2$ can be applied within a frequency range of the position control loop of the mirror M2 as a measure for a magnitude of the disturbance. In a lithographic apparatus, at least a part of the disturbance accelerations on the projection system PS, and in particular on the mirrors thereof, is common to all mirrors, in other words: a mirror M2 is subjected to a certain disturbance, then most likely one or more of the other mirrors, such as the mirror M4 will likely be subjected to a same disturbance. In a projection system such as the one depicted in FIG. 6, the sensitivity of the mirror which is, along the optical path through the projection system, more near to an output of the projection system then to an input of the projection system, is higher (The remarks on sensitivity in the description to FIG. 2 are applicable to the embodiment described here also). A signal which provides an indication of a force to be exerted by an actuator on a mirror to compensate for any disturbances, may be applied as a feed forward correction to correct a position quantity of another one of the mirrors, as the other one of the mirrors is likely to be subject to a same or similar acceleration, disturbance, etc. Advantageously, the correction is applied to mirror M4, providing for an effective correction due to its high sensitivity. In the example shown in FIG. 6, a signal substantially proportional to an acceleration of mirror M2 may be used. However a signal related in any way to an acceleration of this mirror or of any other optical element in the projection system, such as any of the other mirrors, might be applied too. Similarly, instead of applying the feed forward to correct a position of the mirror M4, a position or other position quantity of any other optical element in the projection system might be corrected instead thereof or in addition thereto. As depicted in FIG. 6, a feed forward path is created from an input of the actuator $ACT_2$ of the mirror M2 to an acceleration estimator AE. The acceleration estimator includes a transfer function which includes, in this implementation a factor equal to a quotient of a mass of mirror M2 and a mass of the mirror M4, as according to Newton's law force and acceleration are interrelated to each other dependent on the mass of the optical element in question. In addition thereto, the acceleration estimator AE may also include suitable filtering to filter e.g. undesired frequency components out of the signal provided to the acceleration estimator AE. The acceleration estimator might also include a further input (not shown) which is connected to a setpoint input of the position control loop of the second mirror, enabling the acceleration estimator to prevent to give an output signal (and hence to provide a feed forward signal to the mirror M4) when a setpoint of the second mirror changes or has changed, as such change of setpoint may also result in forces acting on the mirror in question and thus will also provide a signal to the acceleration estimator. To thus prevent that such forces would also lead to a feed forward to the other optical element, i.e. in this example the mirror M4, the transfer function of the acceleration estimator is chosen such that a change in the reference signal and hence a change on a reference signal input (not shown) of the acceleration estimator AE, will counter act, seen from a perspective of an output of the acceleration estimator AE, a signal provided to the acceleration estimator by the acceleration estimator input which is provided with a signal derived from a signal provided by the controller $C_2$ to the actuator $ACT_2$, the latter signal being in response to a change on the reference input of the position control loop of the second mirror M2. The acceleration estimator may be implemented in analogue electronics, may include a digital, numeric implementation or any other suitable implementation. As shown in FIG. 6, the output of the acceleration estimator may act directly on the actuator $ACT_4$ of the mirror M4, however it is also imaginable that the output signal of the acceleration estimator is amplified, filtered or subjected to any other suitable transfer function before being supplied to the actuator $ACT_4$ of the mirror M4. Mirror M4 may also be controlled by a position control loop including a sensor, controller and actuator similar to the one described with reference to mirror M2. In that case, the signal as provided by the acceleration estimator may be fed into the position control loop of mirror M4 by supplying a feed forward signal to an input of the actuator of the position control loop of mirror M4 (e.g. actuator $ACT_4$) and supply a suitable signal derived from the output of the acceleration estimator AE to a setpoint input of the position control loop of the mirror M4. The signal provided to the actuator of the position control loop of mirror M4 will provide for an immediate response of the actuator driving the mirror M4 in reaction to a signal provided by the acceleration estimator AE, and the signal provided to the setpoint input of the position control loop of the mirror M4 will prevent that a feed forward has provided to the actuator input will be compensated by the position control loop of M4 itself.

Thus, with the feed forward as described with reference to FIG. 6, no physical accelerometers are required to measure a vibration level of the projection system, as—at least within a certain frequency band—such accelerations are derived from a signal provided to an actuator of one of the optical elements, in this example the mirror M2. Furthermore, as commonly a noise level of a position control loop of the mirrors is low, and the mass of the mirrors may be high, a quality of the acceleration signal thus derived is to be considered good. Consequently, accelerometers which tend to increase a mass of the projection system and which require a certain building volume may be avoided, thus reducing a total mass and volume of the projection system. Also, in case that the lithographic apparatus would make use of a vacuum environment in which the projection system would be placed, further advantages become apparent as sensors and cables of such accelerometers tend to gas out contaminating such a vacuum environment. The acceleration estimation as described with reference to FIG. 6 may not only be provided for a single degree of freedom, that is applicable to up to 6 degrees of freedom, in which case a plurality of actuators, a plurality of acceleration estimators, etc. may be applied.

The projection system as described with reference to FIG. 6 thus includes a feed forward control device, or feedforward controller, (i.e. in this example the acceleration estimator AE) an input of the feed forward being connected to a signal in a control loop of one of the optical elements (i.e. in this example the position control loop of M2), an output of the feed forward being connected to an actuator of another optical element (in this example the actuator of the mirror M4) to effect a position quantity thereof. Thus, with the projection system as described with reference to FIG. 6, an optical transfer characteristic thereof can be improved, as a correction signal to correct a disturbance, acceleration, etc. on one of the optical elements may be used to derive a feed forward signal to correct a position of another one of the optical elements of the projection system. For an optimum correction, an output beam sensitivity (i.e. a displacement of the output beam as a result of a displacement of the respective optical element) of the other one of the optical elements, i.e. the optical element corrected by the feed forward, should be larger than such output beam sensitivity of the one of the optical elements, i.e. the optical elements of which the acceleration signal is derived.

A first device manufacturing method according to an embodiment of the invention will now be described with reference to FIG. 4: the method includes projecting a patterned beam of radiation (in this example the output beam OB) onto a target portion of the substrate W via the projection system PS. The method includes controlling a position of a movable optical element of the projection system (in this example the position of the mirror M4) to influence a position of the patterned radiation beam OB as projected by the projection system. The method may further include detecting a position of the substrate (in FIG. 4 by the measurement system $DM_B$), providing a position information representing a desired position at which the patterned output beam is to irradiate the substrate (i.e. via the position setpoint PSP), and driving the optical element actuator (in this example actuator ACT of mirror M4), making use of the position information and the detected position of the substrate, to position the movable optical elements (in this example M4) to irradiate the substrate substantially at the desired position.

The invention further includes a device manufacturing method which will be explained with reference to FIG. 6. The method includes projecting a patterned beam of radiation OB onto a target portion of the substrate W via the projection system PS. The projection system comprises two optical elements (in this example M2 and M4) at least partly determining the optical path of the projection system PS. The method further includes controlling a position quantity of one of the optical elements (in this example the mirror M2) by a control loop (in this example the position control loop of M2) and affecting a position quantity of the other one of the optical elements (in this example the mirror M4) based on a signal derived from the control loop (thus in this example the input signal of the actuator in the control loop of mirror M2). The position quantity may include a position, velocity, acceleration, etc.

For both methods according to embodiments of the invention, the same or similar benefits hold and the same or similar preferred embodiments are possible as described with reference to the lithographic apparatuses according to the invention as described above.

In the exemplary embodiments described above, a position of the output beam of the projection system is influenced. Within the scope of the invention, it is not only possible to influence the position of the output beam, however it is also possible to influence any position quantity in general. In this document, the term position quantity may include a position, a velocity, an acceleration, a jerk or any other position related quantity. Thus, the influencing of the position quantity of the radiation beam as projected by the projection system may include influencing of a position, velocity, acceleration, jerk etc. thereof. Hence, where in the above description the term position is used, this can also be interpreted as to comprise a velocity, acceleration, jerk etc. as well. Furthermore, where in this document the term position quantity, positioning, moving, displacing or any related or similar term is used, e.g. when referring to the movable optical element or when referring to the patterned radiation beam or output beam, this is to be interpreted as a position quantity, movement, etc. in respect to any one or more degrees of freedom. In particular, in an embodiment, the position quantity of the movable optical element will be set by the actuator ACT in 6 degrees of freedom, i.e. a position quantity in a three dimensional coordinate system as well as rotational position quantities with respect to all axes of the coordinate system. To achieve this, the actuator ACT may include a plurality of actuator devices, e.g. 6 independent actuators.

Further, the wording change a position quantity of a beam, influence a position quantity of a beam or displace a beam are to be understood as a change of position quantity or direction of the beam in any degree of freedom, thus including any translation, any rotation as well as any combination of one or more translations and rotations.

The terms displacement, movement, change of position etc. may thus include any type of displacement, movement, change of position etc. including a rotation around any axis, a translation in any direction and/or any combination of translations and/or rotations.

The lithographic apparatus according to an embodiment of the invention may include a patterning device, the projection system projecting a patterned beam onto the substrate, however other implementations are possible too, including applications where a non patterned beam scans a target portion of the substrate, 'writing' a pattern on it by suitable movements of the beam. The idea according to the invention may be applied in any kind of these lithographic apparatuses.

The movable optical element may include any type of optical element including a lens, a mirror or any other transmissive and/or reflective element to influence any parameter of a beam, such as its direction, convergence, divergence, spatial distribution or any other optical parameter. The movable optical element may be movable in any degree of freedom, comprising e.g. a translation in any direction, a rotation with respect to any axis or any combination of translation(s) and/or rotation(s).

The influencing of the position quantity of the radiation beam as projected by the projection system may include an influencing of any position quantity parameter of the radiation beam including its position quantity and/or direction with respect to any coordinate system. Further, the influencing of the position quantity of the radiation beam may include any rotation of the beam with respect to any axis.

The optical element actuator may include any type of actuator constructed to have effect on a position quantity of the optical element, including a pneumatic or electric motor, a piezo electric actuator, etc.

The movable optical element may be movable with respect to the projection system in which it is comprised and/or with respect to any part thereof.

The sensor to provide the position quantity signal representative of the position quantity of the radiation beam may include any type of sensor, including e.g. an optical sensor such as a line of sight sensor a camera and may derive the position quantity signal from a position quantity of the radiation beam and/or from a position quantity of any other optical beam, such as a measurement as applied in the line of sight sensor. Alternatively, any other sensor, sensing device or other data collection device to determine a signal representative of the position quantity of the radiation beam may be applied.

The projection system control device, or projection system controller, may include suitable hardware, such as analogue and/or digital electronics, and/or may partly or fully be implemented in software comprising suitable software instructions to, when executed on a programmable device such as a microcomputer, microcontroller, digital signal processor etc., perform a function as specified in this document. The same remarks as made here with reference to the projection system control device are also applicable to any other control device mentioned in this document, such as the feed forward control device.

The term projection system control device as used herein can also be considered or termed as a projection system controller. Similarly, the term feed forward control device can also be considered or termed as a feed forward controller.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   a projection system configured to project a patterned radiation beam onto a target portion of a substrate, said projection system including a movable optical element configured to change, by a displacement thereof, a position of the projected patterned radiation beam;
   an optical element actuator configured to move the optical element;
   a first sensor configured to provide a position signal representative of the position of the projected radiation beam;
   a second sensor configured to determine a position of the movable optical element; and
   a projection system controller, operationally connected to the optical element actuator and configured to drive the optical element actuator based on the position signal provided by the first sensor and an output of the second sensor so as to control the position of the projected radiation beam.

2. The lithographic apparatus of claim 1, wherein the first sensor is operationally connected to the projection system controller, and wherein the projection system controller is arranged to control the optical element actuator based on the position signal provided by the first sensor.

3. The lithographic apparatus of claim 2, wherein the first sensor comprises a line of sight sensor that is configured to determine a line of sight through the projection system.

4. The lithographic apparatus of claim 3, wherein the line of sight sensor is configured to provide a position signal representative of the position of the projected radiation beam with respect to a metrology frame.

5. The lithographic apparatus of claim 2, wherein the first sensor is configured to provide a position signal representative of the position of the projected radiation beam with respect to the projection system, a substrate table that holds the substrate, or a metrology frame.

6. The lithographic apparatus of claim 2, wherein the position of the projected patterned radiation beam is controlled by rotating said movable optical element.

7. The lithographic apparatus of claim 2, wherein the projection system controller comprises:
   (i) a control path extending from a setpoint input to the optical element actuator, the control path comprising a position controller,
   (ii) a first feedback path extending from the second sensor, configured to determine a position of the movable optical element, to the setpoint input, and
   (iii) a second feedback path extending from the first sensor to the setpoint input, the second feedback path comprising a translation gain function.

8. The lithographic apparatus of claim 7, wherein the first feedback path and the second feedback path each include a filter, a filter transfer function of the filter of one of the first and second feedback paths having a substantially complementary filter characteristic of the filter transfer function of the other one of the first and second feedback paths.

9. The lithographic apparatus of claim 7, wherein the first feedback path and the second feedback path comprise a common filter having a first feedback path input and a second feedback path input and a common output, a filter transfer function from the first and second feedback path inputs to the common output having a substantially complementary filter characteristic.

10. The lithographic apparatus of claim 1, further comprising a position detection system configured to detect a position of the substrate, wherein the projection system controller is adapted to drive the optical element actuator to position the movable optical element so as to irradiate the substrate substantially at a desired position, wherein the positioning of the moveable optical element is based on desired position information that include said desired position and on a position of the substrate detected by the position quantity detection system.

11. The lithographic apparatus of claim 10, wherein the desired position information comprises a desired position of the substrate table, wherein the projection system controller comprises a substrate table position control loop configured to control a position of the substrate table, and wherein the projection system controller is adapted to drive the optical element actuator based on an error signal of the substrate table position control loop so as to compensate for a difference between the position of the substrate table and the desired position of the substrate table.

12. The lithographic apparatus of claim 10, wherein the projection system controller comprises an actuator control loop configured to control displacements of said movable optical element and an actuator feed forward path that extends from said substrate table position control loop to the actuator control loop, said actuator feed forward path having a position error signal of the substrate table position control loop as input.

13. The lithographic apparatus of claim 12, wherein the controller further comprises a set point feed forward path that extends from the substrate table position control loop to the set point input of the actuator control loop, said set point feed forward path having said position error signal of the substrate table position control loop as input.

14. The lithographic apparatus of claim 13, further comprising a patterning device support constructed to support a patterning device, the patterning device capable of imparting the radiation beam with a pattern in its cross-section to form the patterned radiation beam, wherein the patterning device support is displaceable by a patterning device actuator which is drivable by the projection system controller, and wherein the projection system controller is arranged to drive the patterning device actuator to position the patterning device in an object plane of the projection system.

15. The lithographic apparatus of claim 10, wherein the desired position information comprises a desired position of the patterned radiation beam as projected by the projection system, wherein the projection system controller is adapted to drive the optical element actuator, based on the desired position of the patterned radiation beam as projected by the projection system, to position the radiation beam to irradiate the desired portion of the substrate.

16. The lithographic apparatus of claim 1, wherein the movable optical element comprises a mirror disposed along an optical path of the projection system.

17. The lithographic apparatus of claim 16, wherein, the mirror is located proximate a projection output of the projection system.

18. The lithographic apparatus of claim 1, wherein the optical element actuator includes a pneumatic motor, an electric motor or a piezo electric element.

19. A device manufacturing method comprising:

projecting a patterned beam of radiation onto a target portion of a substrate via a projection system;

generating a first position signal representative of a position of the projected patterned beam of radiation;

generating a second position signal representative of a position of a movable optical element of the projection system; and controlling a position of the movable optical element of the projection system based on both position signals so as to control the position of the projected patterned beam of radiation.

20. The device manufacturing method of claim 19, comprising:

detecting a position of the substrate, providing a desired position information representing a desired position at which the projected patterned beam of radiation is to irradiate the substrate, driving the optical element actuator, based on the desired position information and the detected position quantity of the substrate, to position the movable optical element so as to irradiate the substrate substantially at the desired position.

* * * * *